United States Patent [19]
Yamazaki et al.

[11] Patent Number: 5,993,202
[45] Date of Patent: Nov. 30, 1999

[54] BAKING FURNACE AND CONTROL METHOD THEREFOR

[75] Inventors: Fumio Yamazaki, Shijyonawate; Hiroshi Asanuma, Ibaraki, both of Japan

[73] Assignee: Matsushita Electric Industrial Co., Ltd., Japan

[21] Appl. No.: 09/166,169

[22] Filed: Oct. 5, 1998

[30] Foreign Application Priority Data

Oct. 9, 1997 [JP] Japan ..................................... 9-276832

[51] Int. Cl.⁶ ....................................................... F27D 7/06
[52] U.S. Cl. ........................... 432/128; 432/171; 373/110; 373/140
[58] Field of Search ..................................... 432/121, 128, 432/153, 163, 164, 171; 373/19, 32, 110, 111, 140

[56] References Cited

U.S. PATENT DOCUMENTS

| | | | |
|---|---|---|---|
| 3,982,887 | 9/1976 | Kendziora et al. | 432/128 |
| 4,397,451 | 8/1983 | Kinoshita et al. | 432/128 |
| 4,627,814 | 12/1986 | Hattori et al. | 432/128 |
| 4,932,864 | 6/1990 | Miyabe | 432/128 |
| 5,044,944 | 9/1991 | Furuya et al. | 432/128 |
| 5,172,849 | 12/1992 | Barten et al. | 432/128 |
| 5,266,027 | 11/1993 | Kuwayama | 432/128 |

*Primary Examiner*—Mark Paschall
*Assistant Examiner*—Gregory A. Wilson
*Attorney, Agent, or Firm*—Parkhurst & Wendel, L.L.P.

[57] ABSTRACT

The present invention prevents a lowering of the baking quality of a baked product due to a variation in the temperature distribution in a baking furnace due to the inflow of air into the baking furnace. A baking furnace has an inlet disposed in a clean room and an outlet disposed in a normal pressure room lower in pressure than the clean room. The baking furnace is provided with a differential pressure gauge, a controller, an inverter, and an exhaust fan installed in a return duct, the arrangement being such that the difference in pressure between the clean room and the normal pressure room is detected by the differential pressure gauge and the operation of the exhaust fan is controlled by the controller according to the detected differential pressure, so that the air flowed in through the inlet is discharged through the return duct. Thus, the air is prevented from flowing into the baking furnace.

9 Claims, 5 Drawing Sheets

BAKING FURNACE AND CONTROL METHOD THEREFOR

FIELD OF THE INVENTION

The present invention relates to a baking furnace and a control method therefor, which are used for the baking of electrodes for plasma displays or semiconductors and the baking of paste for dielectrics.

BACKGROUND OF THE INVENTION

A baking furnace is an indispensable device for a process which involves the baking of electrodes of plasma displays or semiconductors or the baking of paste for dielectrics. The construction of a conventional baking furnace will now be described using a sectional view in FIG. 5.

Figure 5:
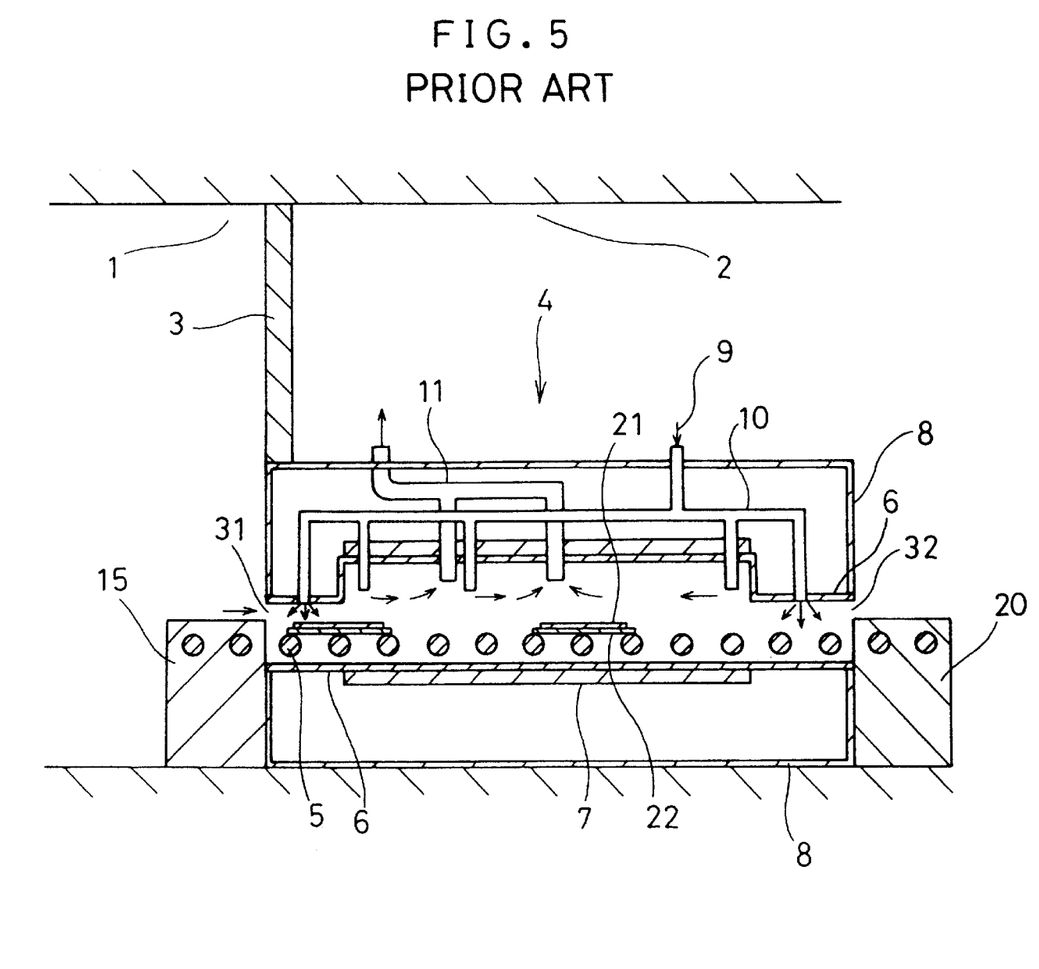
FIG. 5 is a longitudinal section of a conventional baking furnace.

A conventional baking furnace 4 comprises transfer rollers 5, a muffle 6 made of heat resistant glass, a heater 7, a cover, an air feed pipe system 10, an exhaust pipe 11, and an inlet conveyor 15, an outlet conveyor 20.

The muffle 6 is in the form of a flat box rectangular in cross section, extending from the inlet 31 to the outlet 32 of the baking furnace 4. The heater 7 is disposed on the outer periphery of the muffle 6. The air feed pipe system 10 is connected to the muffle 6 to feed air 9 into the latter. The exhaust pipe 11 is a pipe for discharging combustion gases in the muffle 6 to the outside of the baking furnace 4. The muffle 6 and heater 7 are covered by a cover 8. An inlet conveyor 15 is disposed at the inlet 31 of the baking furnace 4 and an outlet conveyor 20 at the outlet 32. Boards 21 supported on support plates 22 enter the baking furnace 4 from the inlet conveyor 15 and are baked as they are transferred in the muffle 6 by the transfer rollers 5 until they are taken out onto the outlet conveyor 20.

The inlet 31 of the conventional baking furnace 4 is positioned on the side associated with a clean room 1. The outlet 32 of the baking furnace 4 is positioned on the side associated with a normal pressure room 2. The clean room 1 and the normal pressure room 2 are separated by a wall 3. The clean room 1 is about 5–10 Pa higher in pressure than the normal pressure room 2.

In such conventional baking furnace 4, since the inlet 31 is disposed on the side associated with the clean room 1 which is higher in pressure than the outlet 32, the difference in pressure between the inlet 31 and outlet 32 of the baking furnace 4 causes the air in the clean room 1 to flow in the muffle 6 from the inlet 31 to the outlet 32 of the baking furnace 4. In the case where the difference in pressure between the clean room 1 and the normal pressure room 2 is 10 Pa, the flow rate of the air flowing in the muffle 6 is 4 m/sec, and in the case of 5 Pa, it is 3 m/sec. Since the cool air in the clean room 1 flows into the baking furnace 4 at said flow rate, the temperature distribution in the muffle 6 varies, presenting a problem that the baking conditions vary to the extent that a baked product of predetermined baking quality cannot be obtained.

For example, in the baking of electrodes for plasma displays or the baking of paste for dielectrics, there arises a problem that the yield of electrodes or dielectrics themselves decreases owing to temperature variations in the muffle 6.

The present invention is intended to solve said problems and provide a baking furnace and a control method therefor, by which a baked product of predetermined baking quality can be obtained.

DISCLOSURE OF THE INVENTION

A baking furnace according to the invention comprises a heating chamber having an inlet disposed in a first space and an outlet disposed in a second space whose pressure is lower than that of the first space, said inlet and outlet being for a material to be heated, transfer means disposed in said heating chamber for transferring the material to be heated which has been transferred to said heating chamber, heating means disposed in the vicinity of said heating chamber, air discharge means connected to a place in the vicinity of the inlet of said heating chamber, differential pressure detecting means installed outside said heating chamber for detecting the difference in pressure between said first and second spaces, and discharge control means for controlling the operation of said air discharge means on the basis of information from said differential pressure detecting means.

Thereby, the air flowing from the inlet into a space in the vicinity of the inlet of the heating chamber can be discharged to the outside of the baking furnace by using the air discharge means installed in the vicinity of the inlet, thus making it possible to prevent the air from flowing into the innermost region of the heating chamber. Therefore, the temperature distribution in the baking furnace can be maintained constant, whereby a baked product of predetermined baking quality can be obtained.

The baking furnace according to the invention comprises a front chamber whose inlet disposed in a first space is provided with opening and closing means, a heating chamber connected to said front chamber through an opening and having an outlet disposed in a second space whose pressure is lower than that of said first space, heating means disposed in the vicinity of said heating chamber, first transfer means installed in said front chamber for transferring a material to be heated by switching the transfer speed between high and low, and second transfer means installed in said heating chamber for transferring said material at low speed.

Thereby, since the opening and closing means is closed except when the material is transferred to the front chamber and since the material can be transferred at high seed to the front chamber, the time during which the opening and closing means is opened can be shortened. Thus, the amount of air flowing through the inlet into the front chamber can be minimized and the air can be substantially prevented from flowing into the heating chamber. Thereby, the temperature distribution in the baking furnace can be maintained constant and a baked product of predetermined baking quality can be obtained. Furthermore, as compared with a baking furnace having air discharge means and differential pressure detecting means, this baking furnace is simpler in construction, making it possible to reduce the production costs thereof.

A baking furnace according to the present invention comprises a front chamber having an inlet disposed in a first space, a heating chamber connected to said front chamber through an opening and having an outlet disposed in a second space whose pressure is lower than that of said first space, transfer means disposed in said front chamber and heating chamber for transferring a material to be heated, heating means disposed in the vicinity of the heating chamber, and an air discharge pipe having a suction port at one end thereof connected to the front chamber and an exhaust port at the other end disposed in the second space.

Thereby, the cross sectional area of the air discharge pipe can be made greater than that of the opening in the baking furnace inlet, and the air flowed into the front chamber flows only little in the direction of the baking furnace, most of the air being discharged through the air discharge pipe. Further, the construction can be made simpler.

A baking furnace according to the invention is provided with discharge assisting means for facilitating air flowed into said front chamber through said inlet to flow toward said air discharge pipe.

Thereby, the air flowed into the front chamber can be guided in the direction of the air discharge pipe by the discharge assisting means, so that the air can be discharged mostly through the air discharge pipe.

A control method for controlling a baking furnace described in claim 1 or 2 of the invention, comprises the steps of measuring the difference in pressure between said first and second spaces by said differential pressure detecting means, and controlling the amount of air being discharged by said air discharge means by said discharge control means according to the results of the measurement.

By this method, the amount of air being discharged by said air discharge means can be changed according to the differential pressure detected by the differential pressure detecting means, so that the air can be discharged only by an amount equal to the amount of the air which has been flowed in, thus preventing the air from flowing into the heating chamber.

A control method for controlling a baking furnace described in claim 4 of the invention comprises the steps of closing said opening and closing means except when said material to be heated is transferred to said front chamber, and transferring said material at high speed to said front chamber by said first transfer means, thereby restricting the air from flowing into said baking furnace.

By this method, the amount of air flowing into the front chamber is restricted to being very small, so that the air flowed into the front chamber can be prevented from flowing directly into the heating chamber.

DESCRIPTION OF THE EMBODIMENTS

Embodiments of the invention will now be described with reference to the drawings.

A first embodiment of the invention will be described with reference to FIG. 1 which is a sectional view and FIG. 2 which is a sectional view taken along the line Z—Z in FIG. 1. In addition, arrangements which are the same as in the prior example described above are denoted by the same reference characters.

Figure 1:
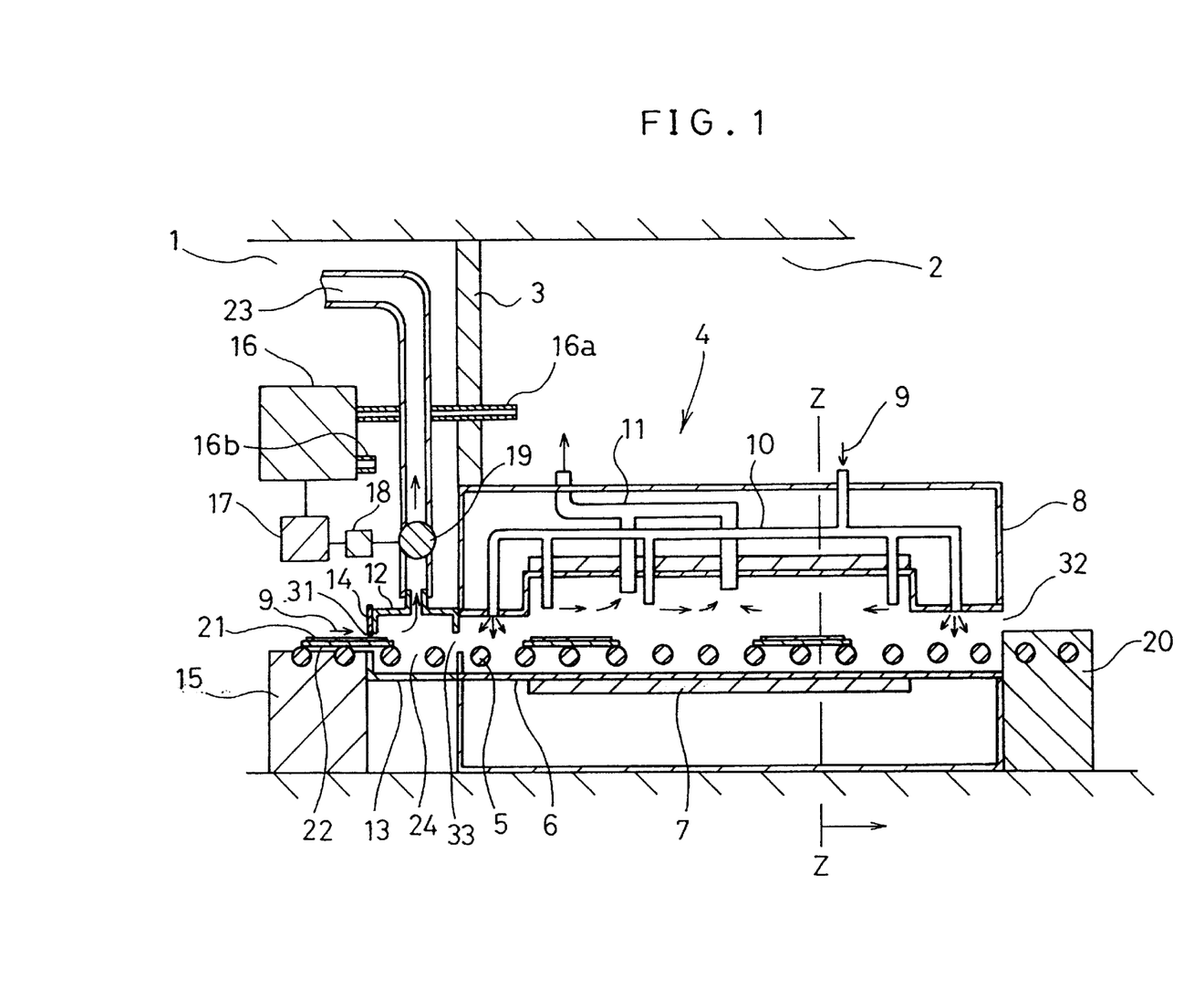
FIG. 1 is a longitudinal section of a baking furnace according to a first embodiment of the present invention.
Figure 2:
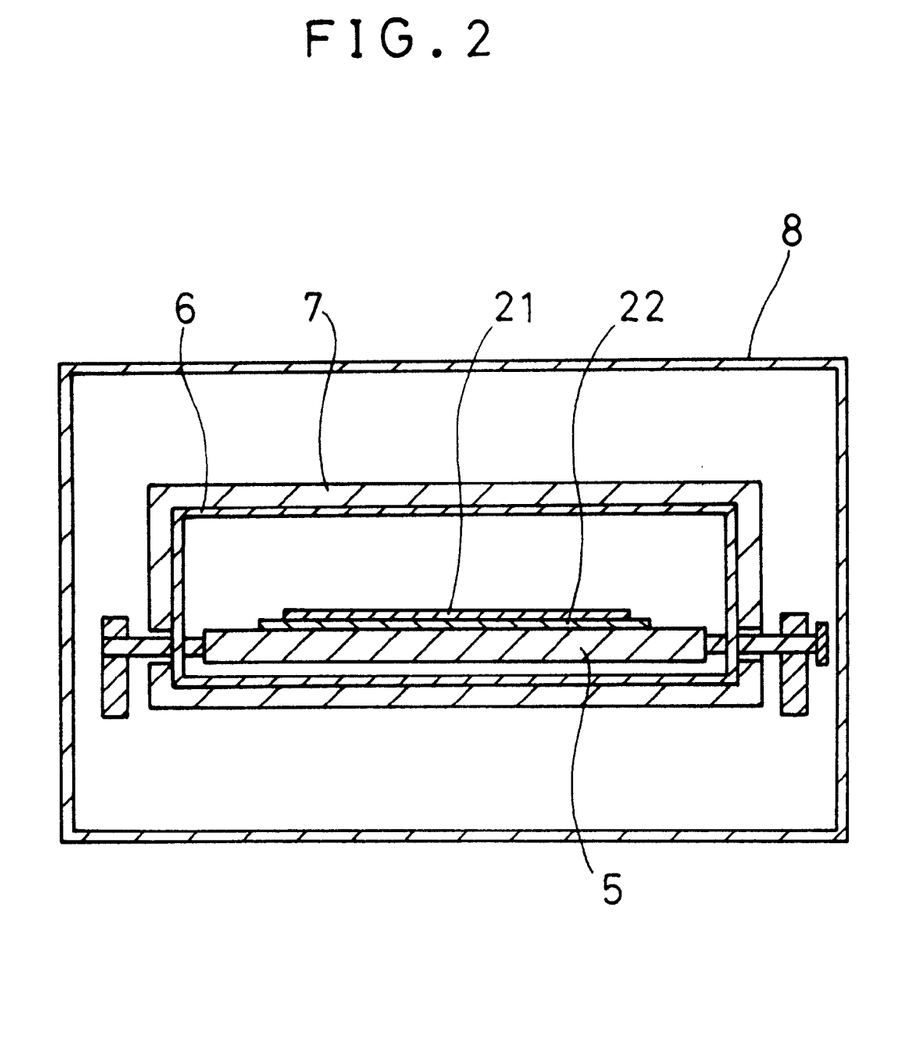
FIG. 2 is a sectional view taken along the line Z—Z in FIG. 1.

In FIG. 1, a baking furnace 4 lies across the boundary between a clean room 1 and a normal pressure room 2. The clean room 1 and the normal pressure room 2 are separated by a wall 3. The pressure in the clean room 1 is controlled so that it is 5–10 Pa higher than that of the normal pressure room 2.

The baking furnace 4 comprises a muffle 6 forming a heating chamber, transfer rollers 5 disposed to extend from the inlet to the outlet of the muffle 6, a heater 7 disposed on the outer periphery of the muffle 6 for heating boards 21 to be baked, a cover 8 which covers the muffle 6 and heater 7, an air feed pipe system 10 having a plurality of spouts for feeding air into the muffle 6, an exhaust pipe 11 having suction ports disposed in the upper region of the muffle 6 for discharging combustion gases in the muffle 6, a front chamber 24 composed of a hood 12 and an airtight cover 13, a control plate 14 for controlling the opening of the inlet 31 of the front chamber 24, an inlet conveyor 15 disposed in the inlet of the muffle 6, a differential pressure gauge (differential pressure detecting means) 16 for measuring the difference in pressure between the clean room 1 and the normal pressure room 2, a controller 17 for producing a control signal from the results of the differential pressure gauge 16, a frequency-variable inverter 18, an exhaust fan 19 for discharging the air in the front chamber 24, an outlet conveyor 20 disposed in the outlet of the muffle 6, and support plates 22 adapted to be transferred with boards 21 placed thereon by the transfer rollers 5.

The transfer rollers 5 are driven by a driving source (not shown). As shown in FIGS. 1 and 2, the muffle 6 is in the form of a flat box rectangular in cross section, extending from the inlet of the baking furnace 4, i.e., an opening 33 in the latter, to the outlet 32. The heater 7 is disposed on the outer periphery of the muffle 6. The air feed pipe system 10 is used to feed air 9 into the muffle 6, having spouts for air 9 disposed respectively in the vicinity of the inlet of the baking furnace 4, in the muffle 6, and in the vicinity of the outlet of the baking furnace 4. The suction ports of the exhaust pipe 11 are attached in the muffle 6 for discharging combustion gases in the muffle 6 into the outside of the baking furnace 4. The hood 12 is installed at the inlet of the baking furnace 4 and has an exhaust port disposed in the upper portion thereof. The airtight cover 13 is disposed in a lower surface for the transfer rollers 5 within the hood 12, whereby the air flowed into the front chamber 24 from the clean room 1 is prevented from leaking through the lower surface for the transfer rollers 5. The hood 12 and airtight cover 13 are integrally combined to constitute the front chamber 24 of the baking furnace 4. The front chamber 24 is formed with the inlet 31 for transfer. The control plate 14 is disposed at the inlet 31 of the front chamber 24 and controls the amount of air flowing from the clean room 1 into the front chamber 24. The inlet conveyor 15 is disposed at the inlet 31 of the front chamber 24, while the outlet conveyor 20 is disposed at the outlet 32 of the baking furnace 4. The differential pressure gauge 16 comprises a first measuring port 16*a* having an end disposed in the normal pressure room 2, and a second measuring port 16*b* having an end disposed in the clean room 1. The controller 17 changes the frequency of the inverter 18 according to the output from the differential pressure gauge 16 so as to control the rpm of the exhaust fan 19 and control the amount of discharge of air. In addition, the exhaust from the exhaust fan 19 is disposed in a return duct 23 leading to the clean room 1; thus, it is arranged that the exhaust is returned to the clean room 1.

The support plates 22 are moved by the transfer rollers 5, traveling through the inlet 31 of the front chamber 24 and the opening 33 in the baking furnace 4 to the outlet 33 of the baking furnace 4. The support plates 22 are heat resistant boards whose size is, for example, 850 mm long, 1300 mm wide and 5 mm thick. The boards 21 to be baked are, for example, glass plates coated with paste, being 554 mm long, 980 mm wide and 2.8 mm thick.

A control method for baking furnaces according to the first embodiment of the invention will now be described.

First, the boards 21 supported on the support plates 22 are conveyed into the front chamber 24 by the inlet conveyor 15 and transferred through the front chamber 24 to the baking furnace 4 by the transfer rollers 5. The boards 21 are passed through the muffle 6 heated by the heater 7. The baking furnace 4 has been controlled to have a predetermined temperature distribution established therein. Fresh air 9 is fed into the muffle 6 through the air feed pipe system 10. Combustion gases are exhausted into the outside of the baking furnace 4 through the exhaust pipe 11. An adjustment has been made so that the feeding of air 9 into the baking furnace 4 and the exhaust of combustion gases are substantially balanced.

In this connection, in the case of the conventional construction shown in FIG. 5, if the inlet 31 of the baking furnace 4 is disposed in the clean room 1 which is higher in pressure than the normal pressure room 2, the air in the clean room 1 will flow into the baking furnace 4. The rate of flow of air into the clean room 1 is equal to the product of the area of the opening in the inlet of the baking furnace 4 and the air speed which is determined by the differential pressure.

Therefore, in the first embodiment of the invention, the front chamber 24 is located upstream of the baking furnace 4, the control plate 14 is installed at the inlet of the front chamber 4, and the position of the control plate 14 is controlled to decrease the area of the opening.

As an example of the opening 33, suppose that the width of the opening is 1500 mm and its height is 20 mm. Then, the area of the opening is 0.03 $m^2$. With a differential pressure of 10 Pa, the air speed is 4 $m^2$/sec; thus, it follows that 0.12 $m^2$/sec of air flows into the baking furnace 4 through the inlet.

Accordingly, in the first embodiment of the invention, the exhaust fan 19 is driven to discharge substantially the same amount of air into the clean room 1 as the amount of air flowed into the front chamber 24, thereby reducing to zero the air inflow from the clean room 1 into the baking furnace 4. As a result, with the absence of inflow of air into the baking furnace 4, it is possible to maintain a stabilized temperature distribution in the baking furnace 4.

Although the baking furnace 4 is operated in such a manner as to ensure that the difference in pressure between the clean room 1 and the normal pressure room 2 is constant at all times, in reality there is a variation of 5–10 Pa in pressure difference. Thus, the pressure difference is detected by the differential pressure gauge 16 and the frequency of the inverter 18 is changed by the controller 17 to change the rpm of the exhaust fan, thereby controlling the rate of discharge of air into the clean room 1. Thereby, even if a difference in pressure between the clean room 1 and the normal pressure room 2 arises, it is possible to prevent the air from flowing from the clean room 1 into the baking furnace 4 since the same amount of air can be discharged into the clean room 1 as the air flowed into the front chamber 24. Since there is no possibility of inflow of the air at room temperature, the temperature distribution in the baking furnace 4 can be maintained stable at all times.

In addition, in the first embodiment of the invention, to effect exhaust by the exhaust fan 19 there has been used a mechanism wherein the air is returned to the clean room 1 through the return duct 23; however, the same effect may be obtained by replacing the return duct 23 by a duct which leads to the normal pressure room 2 and using a mechanism wherein the exhaust from the exhaust fan 19 is flowed into the normal pressure room 2.

Further, in the first embodiment of the present invention, there has been used a construction wherein the hood 12 and airtight cover 13 are integrally formed to provide the front chamber 24 for the baking furnace 4 and the exhaust port is disposed in the top of the hood 12. However, if the muffle 6 has a large volume, a baking furnace having no front chamber 24 may be formed wherein said exhaust port is disposed directly in a place in the muffle close to the inlet of the baking furnace 4, and the air discharge means (inverter 18, exhaust fan 19, and return duct 23) and the discharge control means (differential pressure gauge 16 and controller 17) are installed, with the hood 12 and airtight cover 13 removed.

A second embodiment of the invention will now be described with reference to a sectional view shown in FIG. 3.

Figure 3:
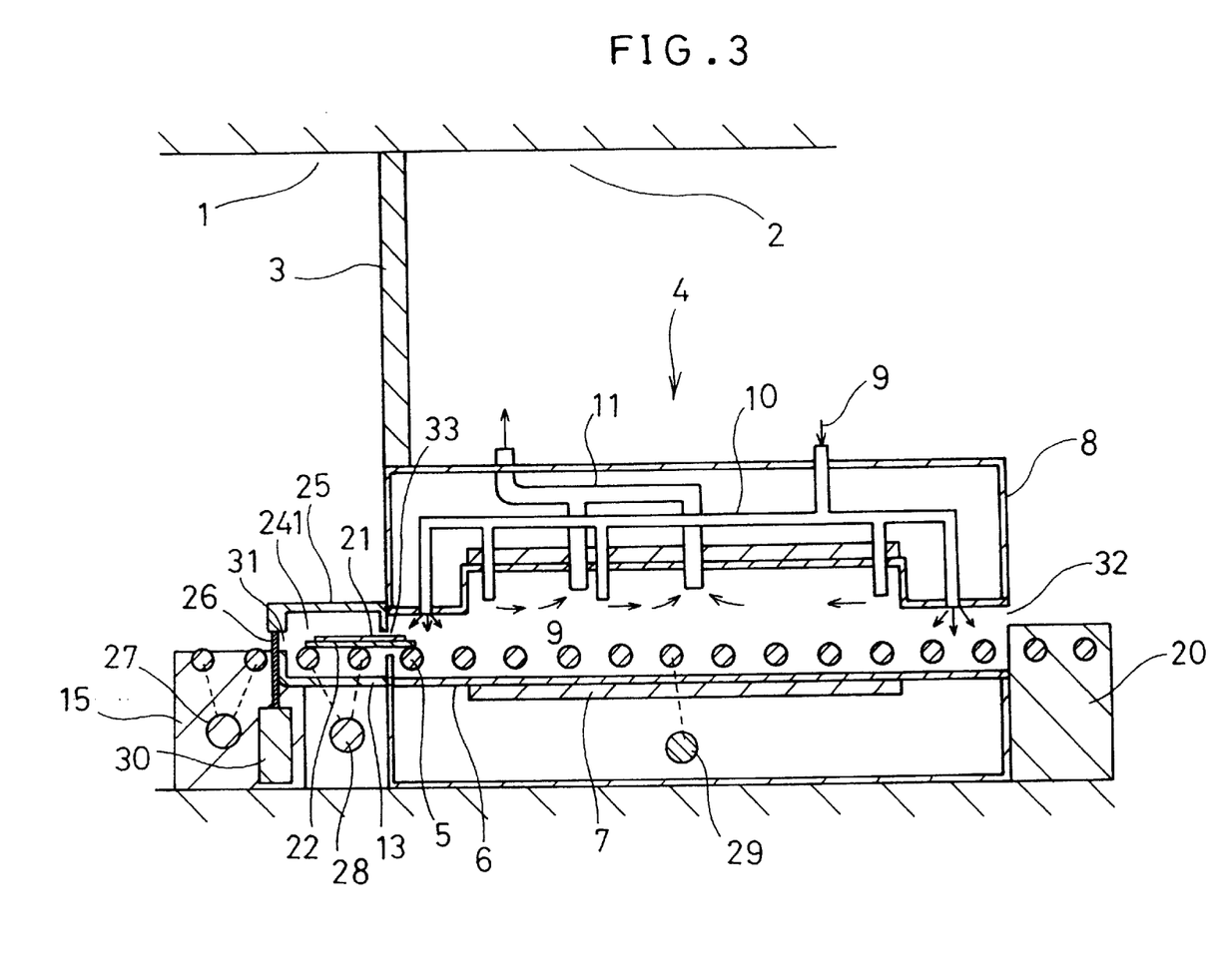
FIG. 3 is a longitudinal section of a baking furnace according to a second embodiment of the present invention.

In FIG. 3, a baking furnace 4 is installed across the boundary between a clean room 1 and a normal pressure room 2. The clean room 1 and the normal pressure room 2 are separated by a wall 3. The pressure in the clean room 1 is controlled so that it is 5–10 Pa higher than that of the normal pressure room 2.

The baking furnace 4 comprises transfer rollers 5, a muffle 6, a heater 7, a cover 8, an air feed pipe system 10, an exhaust pipe 11, an inlet cover 25 constituting a front chamber 241, a shutter 26 disposed at the inlet 31 of the front chamber 241, a cylinder 30 for opening and closing the shutter 26, an inlet conveyor 15, a first motor 27, a second motor 28 and a third motor 29 for driving the transfer rollers 5, an outlet conveyor 20, and support plates 22.

The muffle 6 is in the form of flat box rectangular in cross section, extending from the inlet of the baking furnace 4, i.e., an opening 33 in the latter, to the outlet 32. The heater 7 is disposed on the outer periphery of the muffle 6. The cover 8 covers the muffle 6 and heater 7. The air feed pipe system 10 serves to feed air 9 into the muffle 6, having spouts for air 9 respectively disposed in the vicinity of the inlet of the baking furnace 4, within the muffle 6, and in the vicinity of the outlet of the baking furnace 4. The suction ports of the exhaust pipe 11 are positioned in the muffle 6 to exhaust the combustion gases in the baking furnace 4 into the outside of the muffle 6. The place where the inlet cover 25 is installed is in the front chamber 241 of the baking furnace 4. The first motor 27 is a motor for driving the inlet conveyor 15, and the second motor 28 is a motor for driving the transfer rollers 5 in the front chamber 241 and adapted for switching between high and low driving speeds. The high driving speed is about 50 times the low driving speed. The third motor 29 is a motor for driving the transfer rollers 5 in the muffle 6, said motor being for low speed drive.

A control method for baking furnaces according to the second embodiment of the invention will now be described.

When the board 21 is completely in the front chamber 241, the shutter 26 is closed. When the board 21 has moved from the front chamber 241 completely into the baking furnace 4, the shutter 26 is opened and another board 21 is transferred at high driving speed from the conveyor 15 to the front chamber 241. The board 21 transferred to the front chamber 241 is transferred by the low speed driving of the transfer rollers 5 through the front chamber 241 to the muffle 6 while it is baked. When the shutter 26 is opened, the air in the clean room 1 flows at a speed corresponding to the differential pressure into the front chamber 241; however, since the board 21 is transferred at high driving speed, it is for only a few seconds that the shutter 26 is opened. Further, when the board 21 placed on the support plate 22 passes through the opening 33 in the connecting portion between the front chamber 241 and the baking furnace 4, the area of the opening is reduced by an amount equal to the sum of the thicknesses of the support plate 22 and the board 21, thus reducing the rate of air inflow. In this arrangement, since the time during which the shutter 26 is opened is very short, the amount of air flowing from the clean room 1 into the baking surface 4 can be minimized. Further, the provision of the front chamber 241 provides an effect which ensures that the flow of air from the clean room 1 into the muffle 6 is buffered in the front chamber 241. Therefore, it is possible to prevent variation of the temperature distribution in the baking furnace 4. Further, in this construction, there is no need to provide discharge control means for controlling the air discharge means shown in the first embodiment, so that the construction of the entire baking furnace 4 is simple and the production costs of the baking furnace 4 can be lowered.

Figure 4:
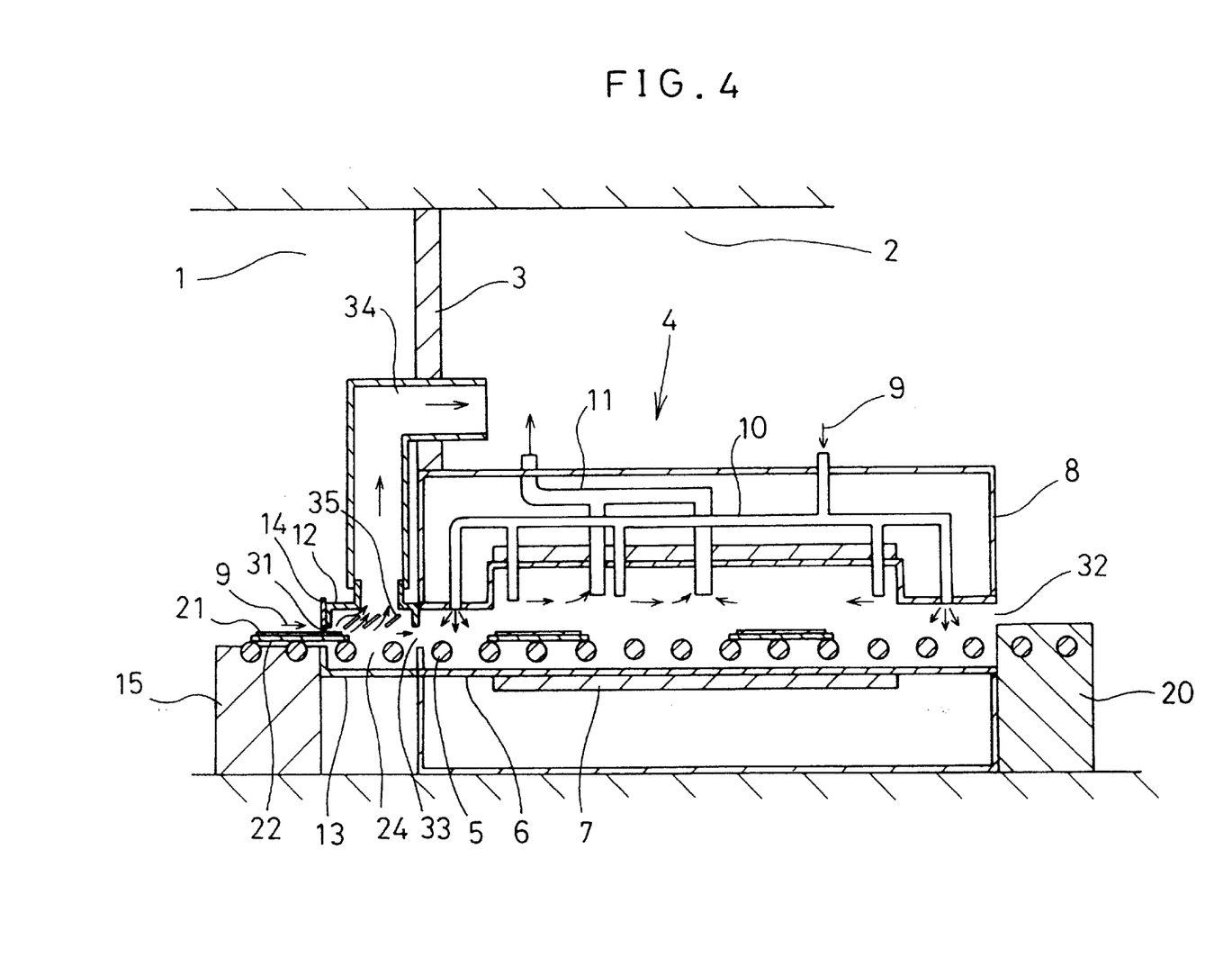
FIG. 4 is a longitudinal section of a baking furnace according to a third embodiment of the present invention.

A third embodiment of the invention will now be described with reference to FIG. 4 which is a sectional view.

What differs from the first embodiment of the invention shown in FIG. 1 is that there is no discharge control means comprising the differential pressure gauge 16 and controller 17 and that the air discharge means comprising the inverter 18, exhaust fan 19 and return duct 23 is replaced by a duct 34 alone.

The rest of the construction is the same as in FIG. 1 and a description thereof is omitted.

The duct 34 is installed such that its suction port at one end thereof is connected to the front chamber 24 and its exhaust port at the other end is positioned within the normal pressure room 2.

Further, the cross sectional area of the duct 34 is larger than the area of the region which connects the front chamber 24 and the baking furnace 4. Thereby, most of the air flowing from the inlet 31 into the front chamber 24 can be discharged from the duct 34.

Although air will more or less flow into the baking furnace 4 through the opening 33, the amount of this air is so small that there is no influence on the temperature distribution in the baking furnace 4.

This construction is simpler than in the second embodiment of the invention.

In addition, the front chamber 24 may be internally provided with a plurality of valves 35 (discharge assisting means) so that the air flowing from the inlet 31 into the front chamber 24 may be guided to the duct 34. Thereby, the air flowing into the front chamber 24 can be discharged from the duct 34.

In addition, in said first and second embodiments, the boards 21 have been shown as electrodes for plasma displays or glass boards coated with a dielectric paste; however, they may be simply glass boards, semiconductor boards, ceramics, metal or the like to be baked, there being no limitation to their uses.

Further, in said first and second embodiments, the muffle 6 has been described as a flat box rectangular in cross section; however, it may be of any shape so long as it is opened at its inlet and outlet. For example, it may be a sleeve which is circular or elliptic in cross section.

In said first and second embodiments, the inlet of the front chamber 24, 241 has been located in the clean room 1 and the outlet 32 of the baking furnace 4 has been located in the normal pressure room 2 which is lower in pressure than the clean room 1; however, the baking furnace 4 may be installed in any place so long as the pressure in the inlet 31 of the front chamber is higher than that in the outlet 32.

What is claimed is:

1. A baking furnace comprising:

a heating chamber having an inlet disposed in a first space and an outlet disposed in a second space whose pressure is lower than that of the first space, said inlet and outlet being for a material to be heated, transfer means disposed in said heating chamber for transferring the material to be heated which has been transferred to said heating chamber, heating means disposed in the vicinity of said heating chamber, air discharge means connected to a place in the vicinity of the inlet of said heating chamber, differential pressure detecting means disposed outside said heating chamber for detecting the difference in pressure between said first and second spaces, and discharge control means for controlling the operation of said air discharge means to prevent an air flow caused by a differential pressure between said first and second spaces from flowing into said heating chamber.

2. A baking furnace comprising:

a front chamber having an inlet disposed in a first space, a heating chamber connected to said front chamber through an opening and having an outlet disposed in a second space whose pressure is lower than that of the first space, transfer means disposed in said front chamber and said heating chamber for transferring a material to be heated, heating means disposed in the vicinity of said heating chamber, air discharge means connected to said front chamber, differential pressure detecting means disposed outside said heating chamber for detecting the difference in pressure between said first and second spaces, and discharge control means for controlling the operation of said air discharge means to prevent an air flow caused by a differential pressure between said first and second spaces from flowing into said heating chamber.

3. A baking furnace comprising:

a front chamber whose inlet disposed in a first space is provided with opening and closing means, a heating chamber connected to said front chamber through an opening and having an outlet disposed in a second space whose pressure is lower than that of the first space, heating means disposed in the vicinity of said heating chamber, first transfer means disposed in said front chamber for transferring a material to be heated by switching the speed between high and low, second transfer means disposed in said heating chamber for transferring the material at low speed, wherein said opening and closing means prevents an air flow caused by a differential pressure between said first and second space from flowing into the heating chamber.

4. A baking furnace comprising:

a front chamber having an inlet disposed in a first space, a heating chamber connected to said front chamber through an opening and having an outlet disposed in a second space whose pressure is lower than that of the first space, transfer means disposed in said front chamber and said heating chamber for transferring a material to be heated, heating means disposed in the vicinity of said heating chamber, and an air discharge pipe having a suction port at one end thereof connected to said front chamber and an exhaust port at the other end disposed in the second space, wherein said discharge pipe prevents an air flow caused by a differential pressure between said first and second spaces from entering the heating chamber.

5. A control method for controlling a baking furnace comprising:

a heating chamber having an inlet disposed in a first space and an outlet disposed in a second space whose pressure is lower than that of the first space, said inlet and outlet being for a material to be heated, transfer means disposed in said heating chamber for transferring the material to be heated which has been transferred to said heating chamber, heating means disposed in the vicinity of said heating chamber, air discharge means connected to a place in the vicinity of the inlet of said heating chamber, differential pressure detecting means disposed outside said heating chamber for detecting the difference in pressure between said first and second spaces, and discharge control means for controlling the operation of said air discharge means to prevent an air flow caused by a differential pressure between said first and second spaces from flowing into said heating chamber, said control method comprising the steps of;

measuring the difference in pressure between said first and second spaces by said differential pressure detecting means, and controlling the amount of air being discharged by said air discharge means by said discharge control means according to the result of the measurement.

6. A control method for controlling a baking furnace comprising:

a front chamber having an inlet disposed in a first space, a heating chamber connected to said front chamber through an opening and having an outlet disposed in a second space whose pressure is lower than that of the first space, transfer means disposed in said front chamber and said heating chamber for transferring a material to be heated, heating means disposed in the vicinity of said heating chamber, air discharge means connected to said front chamber, differential pressure detecting means disposed outside said heating chamber for detecting the difference in pressure between said first and second spaces, and discharge control means for controlling the operation of said air discharge means to prevent an air flow caused by a differential pressure between said first and second spaces from flowing into said heating chamber, said control method comprising the steps of;

measuring the difference in pressure between said first and second spaces by said differential pressure detecting means, and controlling the amount of air being discharged by said air discharge means by said discharge control means according to the result of the measurement.

7. A control method for controlling a baking furnace comprising:

a front chamber whose inlet disposed in a first space is provided with opening and closing means, a heating chamber connected to said front chamber through an opening and having an outlet disposed in a second space whose pressure is lower than that of the first space, heating means disposed in the vicinity of said heating chamber, first transfer means disposed in said front chamber for transferring a material to be heated by switching the speed between high and low, and second transfer means disposed in said heating chamber for transferring the material at low speed, wherein said opening and closing means prevents an air flow caused by a differential pressure between said first and second space from flowing into the heating chamber, said control method comprising the steps of:

closing said opening and closing means except when a material to be heated is transferred to said front chamber, and transferring the material at high speed to said front chamber by said first transfer means, thereby restricting air from flowing into said baking furnace.

8. A baking furnace comprising:

a front chamber having an inlet disposed in a first space, a heating chamber connected to said front chamber through an opening and having an outlet disposed in a second space whose pressure is lower than that of the first space, transfer means disposed in said front chamber and said heating chamber for transferring a material to be heated, heating means disposed in the vicinity of said heating chamber, and an air discharge pipe having a suction port at one end thereof connected to said front chamber and an exhaust port at the other end disposed in the second space, and having a cross-sectional area that is larger than that of the opening.

9. A baking furnace as set forth in claim 8, further comprising discharge assisting means for facilitating air flowing into said front chamber through said inlet to flow toward said air discharge pipe.

* * * * *